United States Patent
Lee

(10) Patent No.: US 7,663,422 B1
(45) Date of Patent: Feb. 16, 2010

(54) SOURCE DRIVING CIRCUIT FOR PREVENTING GAMMA COUPLING

(75) Inventor: Ching-Chung Lee, Tainan County (TW)

(73) Assignee: Himax Technologies Limted, Tainan County (TW)

( * ) Notice: Subject to any disclaimer, the term of this patent is extended or adjusted under 35 U.S.C. 154(b) by 0 days.

(21) Appl. No.: 12/202,542

(22) Filed: Sep. 2, 2008

(51) Int. Cl.
*H03L 5/00* (2006.01)
(52) U.S. Cl. .............................. 327/333; 326/62; 326/81
(58) Field of Classification Search ............. 326/62–63, 326/80–81; 327/306, 333
See application file for complete search history.

(56) References Cited

U.S. PATENT DOCUMENTS

| | | | |
|---|---|---|---|
| 6,373,459 B1 * | 4/2002 | Jeong | 345/100 |
| 7,265,697 B2 * | 9/2007 | Tsai et al. | 341/144 |
| 7,298,196 B2 * | 11/2007 | Teraishi | 327/333 |
| 7,436,219 B2 * | 10/2008 | Chen et al. | 326/105 |

* cited by examiner

*Primary Examiner*—Dinh T. Le
(74) *Attorney, Agent, or Firm*—J.C. Patents

(57) ABSTRACT

During transition, level shifters in a source driver output logic high signals to PMOS DACs and output logic low signals to NMOS DACs for shutting down current paths in the PMOS DACs and in the NMOS DACs. Therefore, during transition, the PMOS DACs and the NMOS DACs are at high-impedance stage for preventing gamma coupling effect.

11 Claims, 8 Drawing Sheets

IN520[011111] ⟶ [100000]

```
              t1      t2      t3
B520[0] (out_n)  1  -> 0  -> 0
B520[1] (out_n)  1  -> 0  -> 0
B520[2] (out_n)  1  -> 0  -> 0
B520[3] (out_n)  1  -> 0  -> 0
B520[4] (out_n)  1  -> 0  -> 0
B520[5] (out_n)  0  -> 0  -> 1
                 ↑     ↑     ↑
                V31  NMOS DAC V32
                       in
                      Hi-Z
```

```
IN540[011111] → [100000]

t1      t2      t3
B540[0] (out_p)     1   ->  1   ->  0
B540[1] (out_p)     1   ->  1   ->  0
B540[2] (out_p)     1   ->  1   ->  0
B540[3] (out_p)     1   ->  1   ->  0
B540[4] (out_p)     1   ->  1   ->  0
B540[5] (out_p)     0   ->  1   ->  1
                    ↑       ↑       ↑
                   V31    PMOS DAC  V32
                           in
                          Hi-Z
```

SOURCE DRIVING CIRCUIT FOR PREVENTING GAMMA COUPLING

BACKGROUND OF THE INVENTION

1. Field of Invention

The present invention relates to a display, and more particularly to a source driving circuit in the display.

2. Description of Related Art

Various types of electronic devices have display devices, such as TVs, laptop computers, monitors and mobile communication terminals. The display devices are requested to be thin and/or light in order to save the volume and the cost of the electronic devices. To satisfy these requirements, various Flat Panel Displays (FPDs) have been developed as alternatives to more conventional cathode ray tube displays. A Liquid Crystal Display (LCD) is one kind of Flat Panel Display. The LCD device includes a timing controller, a gate driver, a display panel and a source driver.

Generally, digital video data are transmitted to the LCD device from an external host system, e.g., a graphic source. The video data format is converted by the timing controller of the LCD device, and transmitted to the source driver of the LCD device. In addition, the timing controller generates various control signals to the source driver and the gate driver for controlling the source driver and the gate driver to operate. Under the control of the control signals, the gate driver sequentially drives each gate line and then the source driver transmits the video data to the pixels on each gate line via the data lines for displaying the image.

FIG. 1 shows a block diagram of a conventional source driver. Referring to FIG. 1, the source driver 100 includes a shift register 110, a level shifter 120, a digital-to-analog converter 130 and an output buffer 140. The shift register 110 stores the video data in response to the horizontal synchronization signal (not shown in FIG. 1). Since the shift register 110 and the digital-to-analog converter 130 respectively operate at different voltage level, the level shifter 120 transforms the voltage level of the outputs of the shift register 110 to fit in with the voltage level of the digital-to-analog converter 130. The digital-to-analog converter 130 converts the digital video data into the analog signals and the output buffer 140 enhances the driving ability of the analog signals for driving the pixels on display panel.

The level shifter plays an important role in the source driver. However, the transition state of the level shifter may trigger the digital-to-analog converter 130 to output inaccurate voltage to the display panel. Under some circumstances, the inaccurate voltage outputted while the level shifter is in transition state may be considerably different to the voltage outputted while the level shifter is in normal state. In the meanwhile, the voltage outputted by the digital-to-analog converter 130 changes dramatically, and thus a large current is induced. The unexpected situation may cause the abnormal operation of the source driver. Therefore, it is desirable to design a proper level shifter to solve the said problem.

SUMMARY OF THE INVENTION

The invention provides a source driving circuit for preventing gamma coupling and short currents during transition.

One example of the invention provides a source driving circuit including a level shifter and a digital-to-analog converter. The level shifter includes cross-coupled first transistor, second transistor, third transistor and a fourth transistor, and is connected to a power supply via a fifth transistor. While the input signal is in a transition period, the fifth transistor is turned off. The digital-to-analog converter includes a transistor array for receiving output signals from the level shifter to generate an analog voltage, and is in a high impedance state during the transition period.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
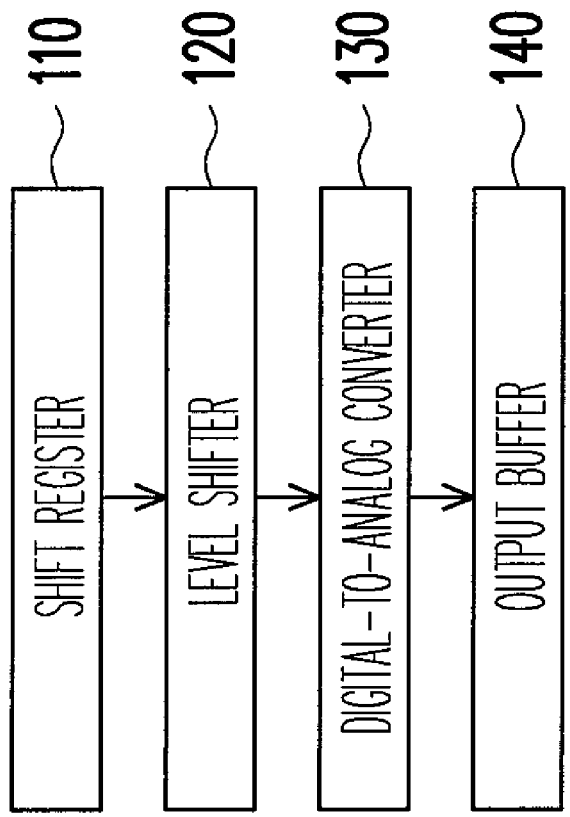
FIG. 1 is a block diagram of a conventional source driver.

Reference will now be made in detail to the present embodiments of the invention, examples of which are illustrated in the accompanying drawings. Wherever possible, the same reference numbers are used in the drawings and the description to refer to the same or like parts.

In embodiments of the invention, during transition of input signals, DACs inside the source driving circuit will be in high-impedance states to improve gamma coupling and short current.

Figure 2A:
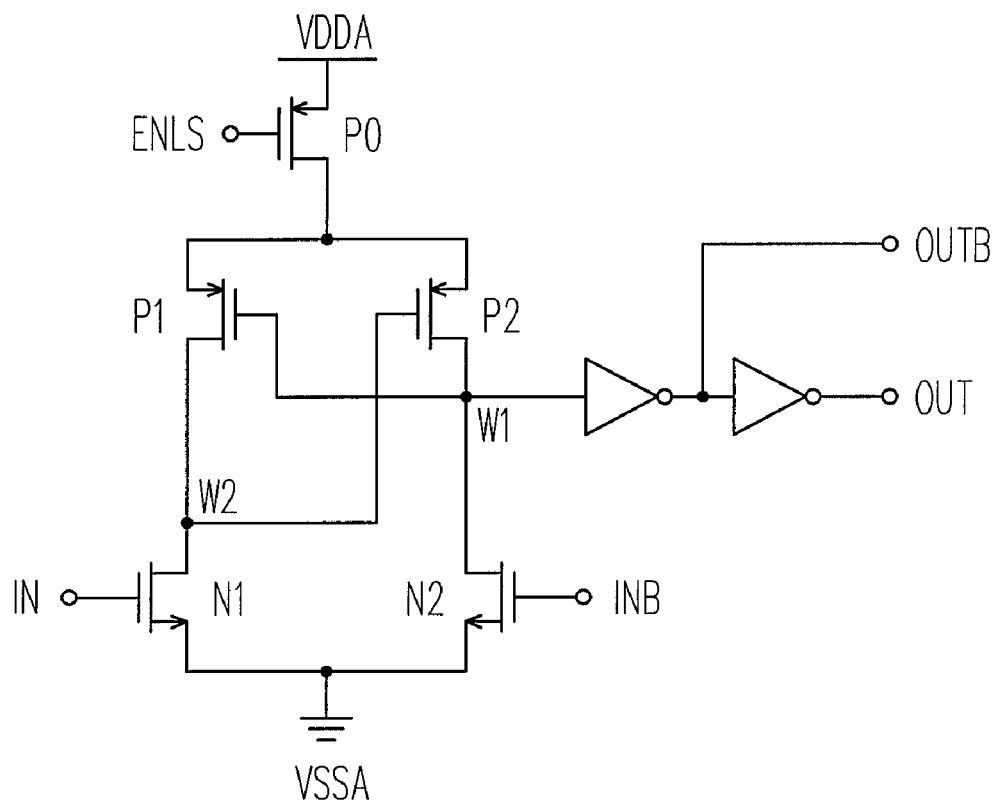
FIG. 2A is a circuit diagram of a conventional level shifter.
Figure 2B:
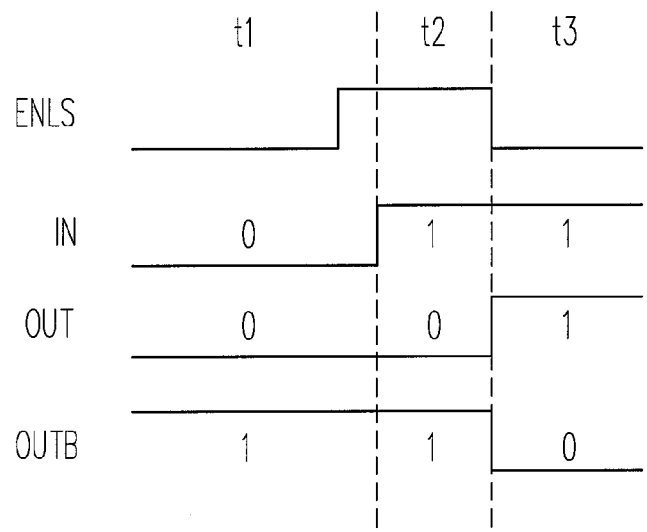
FIGS. 2B and 2C illustrate timing diagrams of the level shifter in FIG. 2A.

It is found by the inventor that under some circumstances the digital-to-analog converter may output inaccurate voltage due to a gamma couple effect in the conventional source driver. The gamma couple effect is explained in the FIGS. 2-4. FIG. 2A is a circuit diagram of a conventional level shifter. FIG. 2B illustrates a timing diagram of the level shifter while the input signal IN is changing from logic low (0) to logic high (1). At period t1, the input signal IN is in logic low (0) and the output signal OUT is thus in logic low (0). At period t2, the input signal IN is changed to logic high (1) to turn on the transistor N1, the input signal INB is changed to logic low (0) to turn off the transistor N2, and the control signal ENLS is unasserted to turn off the transistor P0. Therefore the output signal OUT remains at the previous state, i.e. the output signal OUT is in logic low (0), since the node W1 is floating. At period t3, the control signal ENLS is asserted to turn on the transistor P0, and the voltage at the node W1 is pulled high via the transistors P2 and P0, such that the output signal OUT is changed to logic high (1). The other output signal OUTB is simply an inverse signal of the output signal OUT.

Figure 2C:
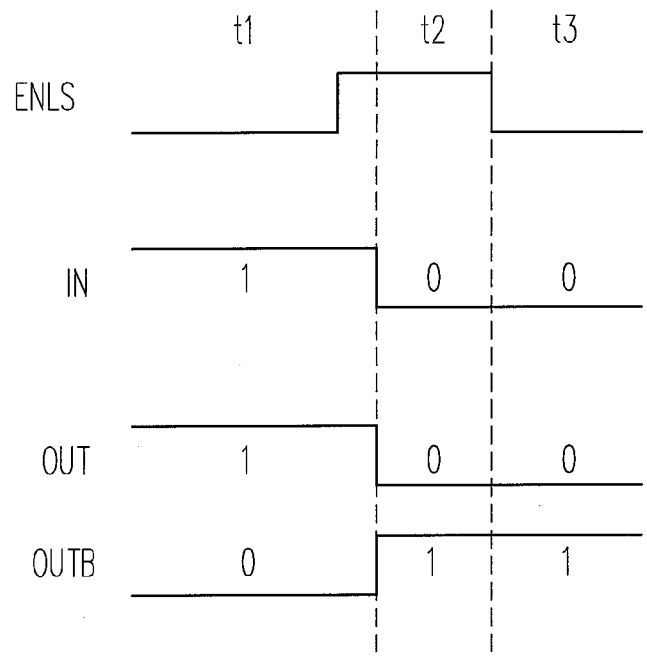

FIG. 2C illustrates a timing diagram of the level shifter while the input signal is changing from logic high (1) to logic low (0). At period t1, the input signal IN is in logic high (1) and the output signal OUT is thus in logic high (1). At period t2, the input signal IN is changed to logic low (0) to turn off the transistor N1, the input signal INB is changed to logic high (1) to turn on the transistor N2, and the control signal ENLS is unasserted to turn off the transistor P0. Then the output signal OUT is changed to logic low (0), since the node W1 is pulled low via the transistor N2. At period t3, the control signal ENLS is asserted to turn on the transistor P0, and the output signal OUT remains to be in logic low (0).

It should be noted that at the transition period t2, the output signal OUT is in logic low (0) both in FIG. 2B and in FIG. 2C, no matter the input signal is changed from logic low (0) to logic high (1), or from logic high (1) to logic low (0).

Figure 2D:
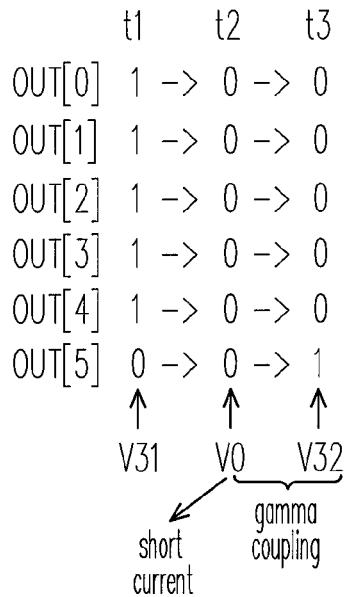
FIG. 2D illustrates a timing diagram of the digital pixel data changing from 31(i.e. 0b011111) to 32(i.e. 0b100000)

The digital-to-analog converter (DAC) includes a switch array (not shown in the figures), each switch is controlled by an output signal or an inversed output signal from a corresponding level shifter as illustrated in FIG. 2A. The n-bit digital pixel signal received by the source driver is level-shifted by n level shifters and controls the switches of the DAC to output a corresponding analog voltage. FIG. 2D illustrates a timing diagram of the digital pixel data changing from 31 (i.e. 0b011111) to 32 (i.e. 0b100000) for example. At the period t1, the digital pixel data IN[5:0] is [011111] so that the output signals OUT[5:0] outputted by the level shifters are [011111], and thus the DAC outputs an analog voltage V31. At the period t2, the output signals OUT[5:0] of the level shifters become [000000] because every bit of the digital pixel data IN[5:0] is inversed while the digital pixel data IN[5:0] is changed to [100000], according to the description in FIG. 2B and FIG. 2C, and thus the DAC outputs an analog voltage V0. At the period t3, the output signals OUT[5:0] of the level shifters are changed to [100000], and thus the DAC outputs an analog voltage V32. That is, the DAC respectively outputs the analog voltages V31, V0 and V32 at the periods t1, t2, and t3. The voltage changes from V0 to V32 dramatically such that a large current is induced in the gamma resistor string inside the DAC to alter the gamma voltage V0 (at t2) to the gamma voltage V32 (at t3). Therefore, the gamma voltage V32 may not be accurate due to this large current, which is called "gamma coupling".

Figure 3:
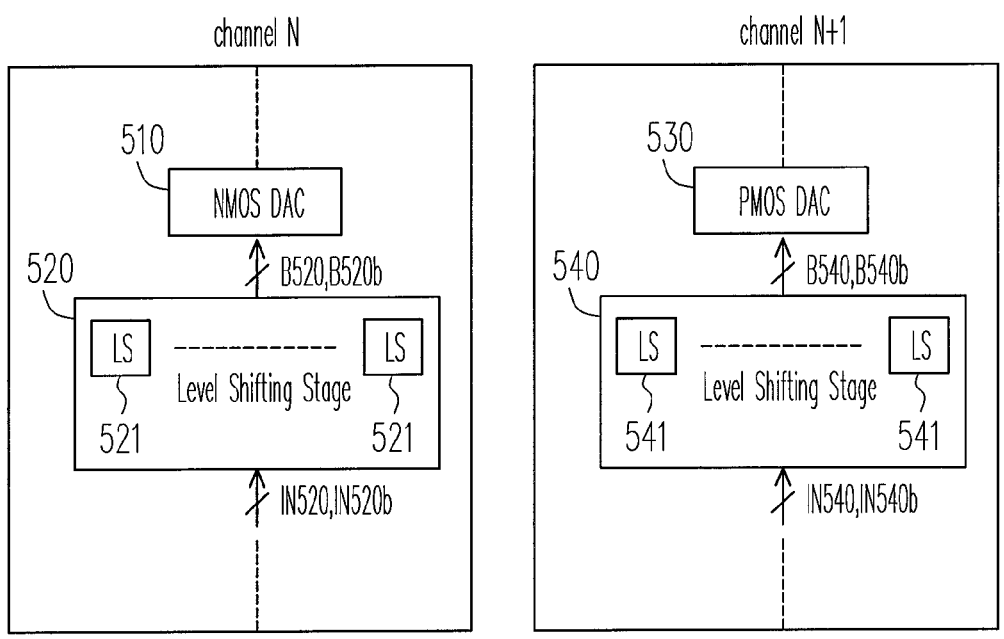
FIG. 3 is a simplified diagram of two channels inside a source driving circuit.

FIG. 3 is a simplified diagram of two channels N and N+1 inside a source driving circuit (N is a natural number). In channel N, a level shifting stage 520 receives digital pixel data IN520 (e.g. 6 bits) and IN520b and generates output signals B520 and B520b. The pixel data IN520b is an inverse signal of the pixel data IN520, and the output signal B520b is an inverse signal of the output signal B520 during non-transition period. The output signals B520 and B520b are inputted to the NMOS DAC 510. Similarly, in channel N+1, a level shifting stage 540 receives digital pixel data IN540 (e.g. 6 bits) and IN540b and generates output signals B540 and B540b. The pixel data IN540b is an inverse signal of the pixel data IN540, and in normal state, the output signal B540b is an inverse signal of the output signal B540 while the level shifting stage 540 is during non-transition period. The output signals B520 and B520b are inputted to the PMOS DAC 530.

The level shifting stage has a lot of level shifters (LS), and each level shifter is responsible for shifting the level of one bit of the digital pixel data IN520 or IN540. For example, one of the level shifters 521 is responsible for shifting levels of the least significant bit (LSB) IN520[0] of the pixel data IN520 and the LSB IN520b[0] of the pixel data IN520b to respectively generate the output signals B520[0] and B520b[0]. Similarly, one of the level shifters 541 is responsible for shifting levels of the LSB IN540[0] of the pixel data IN540 and the LSB IN540b[0] of the pixel data IN540b to respectively generate the output signals B540[0] and B540b[0].

Figure 4A:
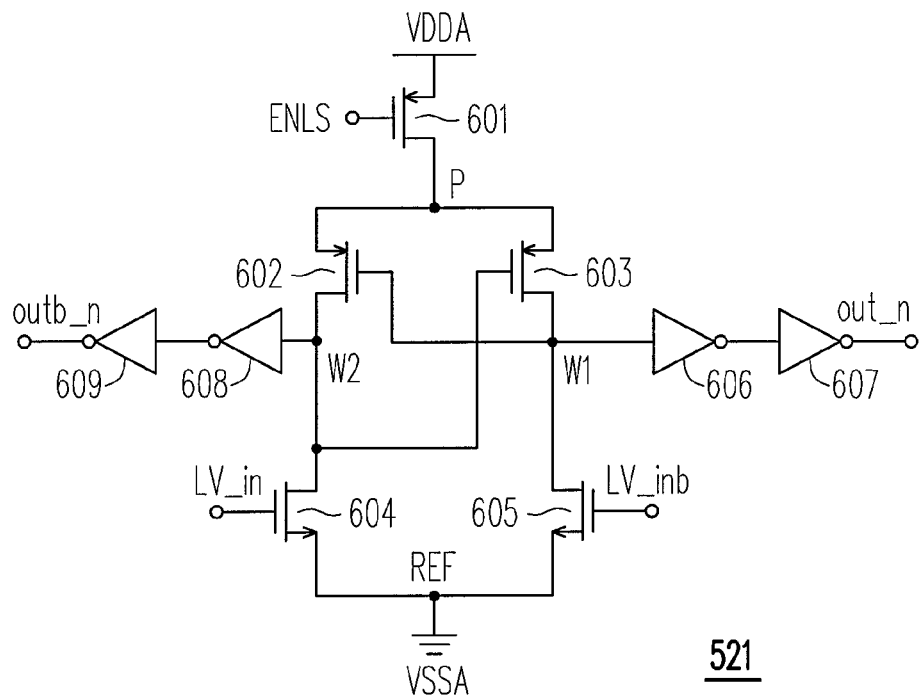
FIG. 4A is a circuit diagram of a level shifter according to an embodiment of the invention.

FIG. 4A is a circuit diagram of a level shifter 521 according to an embodiment of the invention. The level shifter 521 includes transistors 601 through 605 and inverters 606 through 609. The transistor 601 has a source coupled to a power supply VDDA, a gate coupled to a control signal ENLS, and a drain coupled to a power node P. The transistor 602 is connected between the drain of the transistor 601 and the node W2, and controlled by the voltage at the node W1. The transistor 603 is connected between the drain of the transistor 601 and the node W1, and controlled by the voltage at the node W2. The transistor 604 is connected between the node W2 and the reference node REF, and controlled by the input signal LV_in, wherein the reference node REF is connected to the voltage VSSA. The transistor 605 is connected between the node W1 and the reference node REF, and controlled by the input signal LV_inb, wherein the input signal LV_inb is an inverse signal of the input signal LV_in.

The inverters 606 and 607 are serially connected to function as a buffer for outputting an output signal out_n. The inverters 608 and 609 are serially connected to function as a buffer for outputting an output signal outb_n. The inverters 606 through 609 are optional in the embodiment. That is to say the output signal out_n can be outputted directly from the node W1 and the output signal outb_n can be outputted directly from the node W2.

Referring FIG. 3 and FIG. 4A, the level shifter 521 outputs the output signals out_n and outb_n to the NMOS DAC 510. More specifically, the output signals out_n from respective level shifters are outputted to serve as bits of the output signal B520 and the signals outb_n from respective level shifters are outputted to serve as bits of the output signal B520b.

Figure 4B:
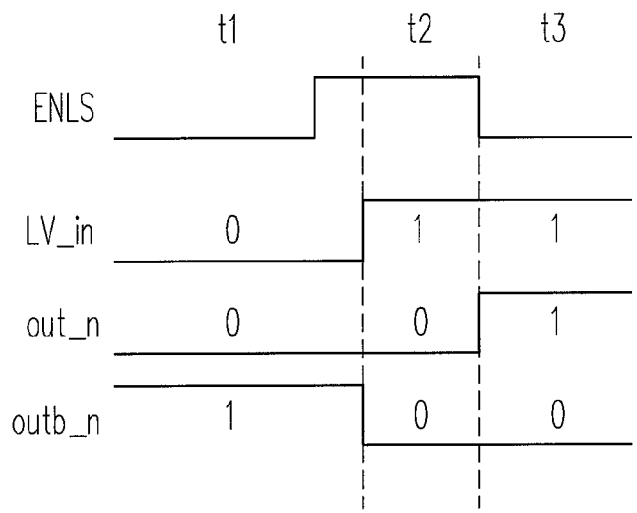
FIGS. 4B and 4C illustrate timing diagrams of the level shifter in the embodiment of FIG. 4A.

FIG. 4B illustrates a timing diagram of the level shifter 521 while the input signal LV_in is changing from logic low (0) to logic high (1). At period t1, the input signal LV_in is in logic low (0), thus the output signals out_n and outb_n are respectively in logic low (0) and in logic high (1). At period t2, the input signal LV_in is changed to logic high (1) to turn on the transistor 604, the input signal LV_inb is changed to logic low (0) to turn off the transistor 605, and the control signal ENLS is unasserted to turn off the transistor 601. Therefore the output signal out_n remains at the previous state, i.e. logic low (0), since the node W1 is floating, and the output signal outb_n becomes logic low (0) because the transistor 604 is turned on. At period t3, the control signal ENLS is asserted to turn on the transistor 601, and the voltage at the node W1 is pulled high via the transistors 603 and 601, such that the output signal out_n is changed to logic high (1), while the output signal outb_n remains in logic low (0).

Figures 4C, 4D:
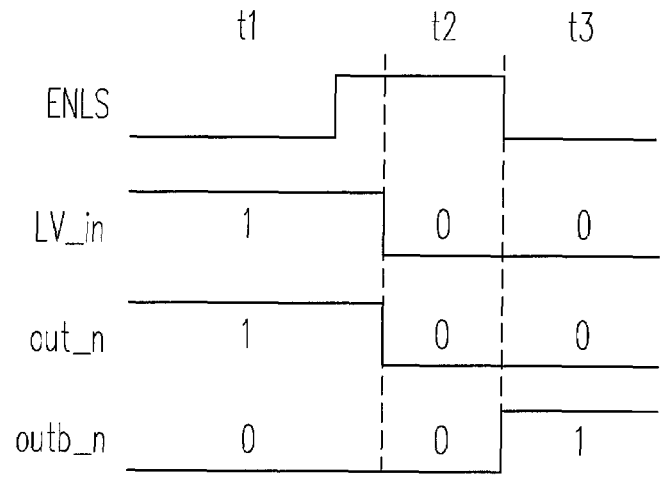
FIG. 4D illustrates a timing diagram of the digital pixel data IN520[5:0] changing from 31(i.e. 0b011111) to 32(i.e. 0b100000) in the embodiment of FIG. 4A.

FIG. 4C illustrates a timing diagram of the level shifter 521 while the input signal is changing from logic high (1) to logic low (0). At period t1, the input signal LV_in is in logic high (1), thus the output signals out_n and outb_n are respectively in logic high (1) and in logic low (0). At period t2, the input signal LV_in is changed to logic low (0) to turn off the transistor 604, the input signal LV_inb is changed to logic high (1) to turn on the transistor 605, and the control signal ENLS is unasserted to turn off the transistor 601. Then the output signal out_n is changed to logic low (0), since the voltage at the node W1 is pulled low via the transistor 605, while the output signal outb_n remains in logic low (0) since the node W2 is floating. At period t3, the control signal ENLS is asserted to turn on the transistor 601, and the output signal out_n remains to be in logic low (0) while the output signal outb_n becomes logic high (1) because the voltage at the node W2 is pulled high via the transistor 602.

It should be noted that at the transition period t2, the output signals out_n and outb_n are in logic low (0) both in FIG. 4B and in FIG. 4C, no matter the input signal is changed from logic low (0) to logic high (1), or from logic high (1) to logic low (0). Since the level shifter 521 outputs the output signals to the NMOS DAC, none of the switches in the NMOS DAC is turned on during the transition period t2, that is, the NMOS DAC is in a high-impedance state.

FIG. 4D illustrates a timing diagram of the digital pixel data IN520[5:0] changing from 31(i.e. 0b011111) to 32(i.e. 0b100000) for example. At the period t1, the digital pixel data IN520[5:0] is [011111] so that the output signals B520[5:0] outputted by the level shifting stage 520 are [011111] and the NMOS DAC 510 outputs an analog voltage V31. At the period t2, the output signals B520[5:0] and B520b[5:0] become [000000] because every bit of the digital pixel data is inversed while the digital pixel data IN520[0:5] is changed to [100000], according to the description in FIG. 4B and FIG. 4C, and thus none of the switches of the NMOS DAC 510 is tuned on such that the NMOS DAC 510 does not output analog voltages. At the period t3, the output signals B520[5:0] is changed to [100000], and thus the NMOS DAC 510 outputs an analog voltage V32. That is, the DAC respectively outputs the analog voltages V31, and V32 at the periods t1, and t3. The change from the voltage V31 to the voltage V32 is not dramatic such that the "gamma coupling" effect is eliminated.

Figure 5A:
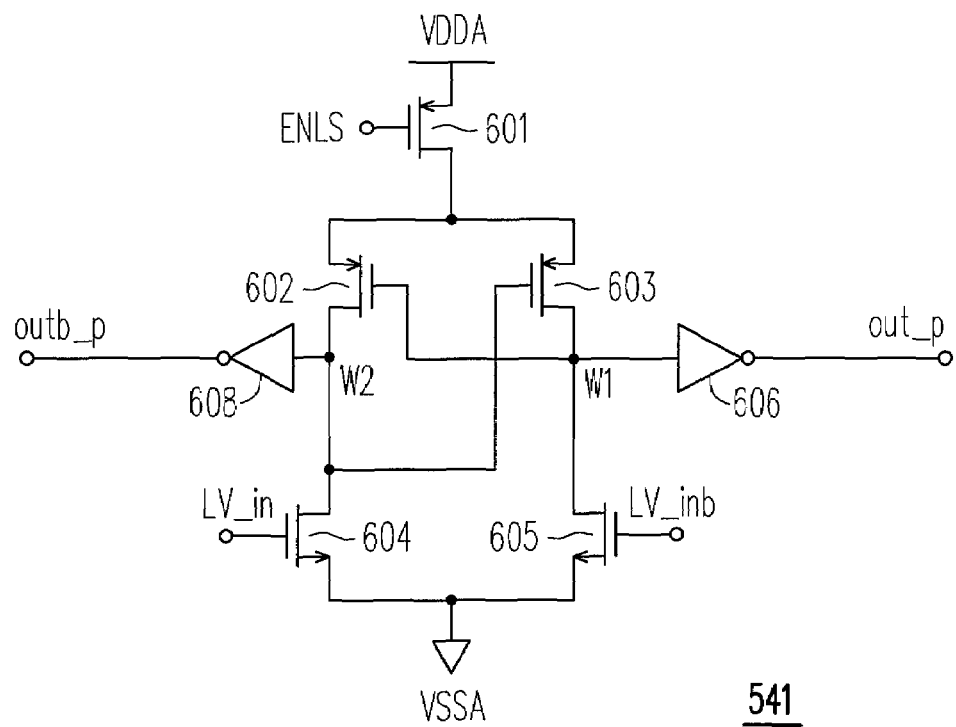
FIG. 5A is a circuit diagram of a level shifter according to an embodiment of the invention.

FIG. 5A is a circuit diagram of a level shifter 541 according to the embodiment of the invention. The level shifter 541 includes transistors 601 through 605 and inverters 606 and 608. The inverters 606 is connected to the node W1 for outputting an output signal outb_p. The inverters 608 is connected to the node W2 for outputting an output signal out_p. The level shifter 541 outputs the output signals out_p and outb_p to the PMOS DAC 530. More specifically, referring to FIG. 3 and FIG. 5A, the signals out_p from respective level shifters are outputted to serve as bits of the signal B540 and the signals outb_p from respective level shifters are outputted to serve as bits of the signal B540b.

Figure 5B:
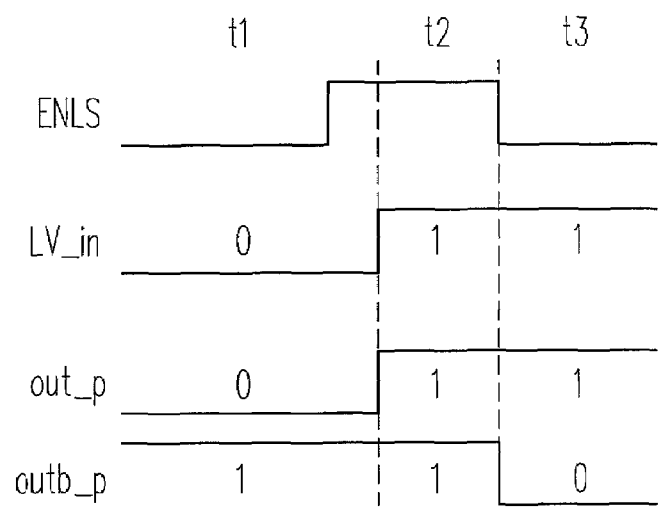
FIGS. 5B and 5C illustrate timing diagrams of the level shifter in the embodiment of FIG. 5A.

FIG. 5B illustrates a timing diagram of the level shifter 541 while the input signal LV_in is changing from logic low (0) to logic high (1). At period t1, the input signal LV_in is in logic low (0) so that the output signals out_p and outb_p are respectively in logic low (0) and in logic high (1). At period t2, the input signal LV_in is changed to logic high (1) to turn on the transistor 604, the input signal LV_inb is changed to logic low (0) to turn off the transistor 605, and the control signal ENLS is unasserted to turn off the transistor 601. Therefore, the output signal outb_p remains at the previous state, i.e. logic high (1), since the node W1 is floating, and the output signal out_p becomes logic high (1) because the transistor 604 is turned on. At period t3, the control signal ENLS is asserted to turn on the transistor 601, and the voltage at the node W1 is pulled high via the transistors 603 and 601, such that the output signal outb_p is changed to logic low (0), while the output signal out_p remains to be in logic high (1).

Figures 5C, 5D:
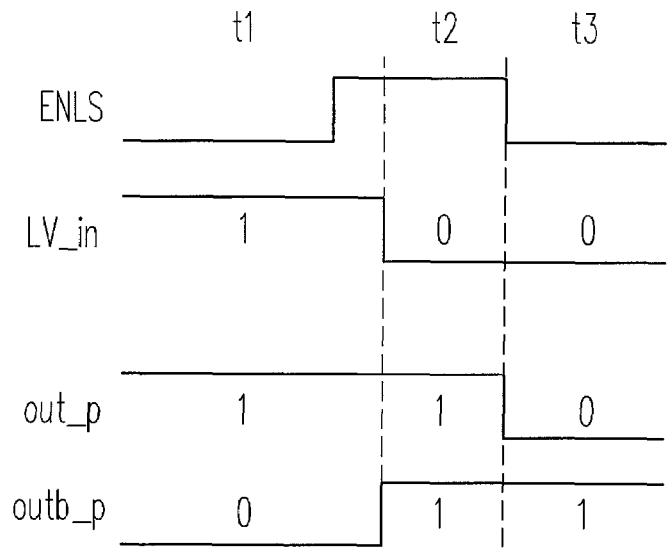
FIG. 5D illustrates a timing diagram of the digital pixel data IN540[5:0] changing from 31(i.e. 0b011111) to 32(i.e. 0b100000) in the embodiment of FIG. 5A

FIG. 5C illustrates a timing diagram of the level shifter 541 while the input signal is changing from logic high (1) to logic low (0). At period t1, the input signal LV_in is in logic high (1), thus the output signals out_p and outb_p are respectively in logic high (1) and in logic low (0). At period t2, the input signal LV_in is changed to logic low (0) to turn off the transistor 604, the input signal LV_inb is changed to logic high (1) to turn on the transistor 605, and the control signal ENLS is unasserted to turn off the transistor 601. Then the output signal outb_p is changed to logic high (1), since the voltage at the node W1 is pulled low via the transistor 605, while the output signal out_p remains to be in logic high (1) since the node W2 is floating. At period t3, the control signal ENLS is asserted to turn on the transistor 601, and the output signal outb_p remains to be in logic high (1) while the output signal out_p becomes logic high (1) because the voltage at the node W2 is pulled high via the transistor 602.

It should be noted that at the transition period t2, the output signals out_p and outb_p are in logic high (1) both in FIG. 5B and in FIG. 5C, no matter the input signal is changed from logic low (0) to logic high (1), or from logic high (1) to logic low (0). Since the level shifter 541 outputs the output signals to the PMOS DAC, none of the switches in the PMOS DAC is turned on during the transition period t2, that is, the PMOS DAC is in a high-impedance state.

FIG. 5D illustrates a timing diagram of the digital pixel data IN540[5:0] changing from 31(i.e. 0b011111) to 32(i.e. 0b100000) for example. At the period t1, the digital pixel data IN540[5:0] is [011111] so that the output signals B540[5:0] outputted by the level shifting stage 540 are [011111] and the PMOS DAC 530 outputs an analog voltage V31. At the period t2, the output signals B540[5:0] and B540b[5:0] become [111111] because every bit of the digital pixel data is inversed while the digital pixel data IN540[5:0] is changed to [100000], according to the description in FIG. 5B and FIG. 5C, and thus none of the switches of the PMOS DAC 530 is tuned on such that the PMOS DAC 530 does not output analog voltages. At the period t3, the output signals B540[5:0] is changed to [100000], and thus the PMOS DAC 530 outputs an analog voltage V32. That is, the PMOS DAC 530 respectively outputs the analog voltages V31, and V32 at the periods t1, and t3. The change from the voltage V31 to the voltage V32 is not dramatic such that the "gamma coupling" effect is eliminated.

As the above description, during signal transition, the level shifters output logic low (0) signals to NMOS DAC and logic high (1) signals to PMOS DAC. As a result, during signal transition, the NMOS DAC and the PMOS DAC are at hi-Z state, for preventing gamma coupling and short currents.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:

1. A source driving circuit, comprising:
   a level shifter comprising:
   a first transistor connected between a first output node and a reference node, and controlled by a first input signal;
   a second transistor connected between a second output node and the reference node, and controlled by a second input signal, which is an inverse signal of the first input signal;
   a third transistor connected between the first output node and a power node, and controlled by an signal of the second output node;
   a fourth transistor connected between the second output node and the power node, and controlled by an signal of the first output node; and
   a fifth transistor connected between the power node and a power supply, and the fifth transistor is turned off by a control signal while the first input signal and the second input signal are in a transition period in which the first input signal changes from a logic high to a logic low or the first input signal changes from a logic low to a logic high; and a digital-to-analog converter comprising a switch array, wherein the switch array receives output signals from the first output node and the second output node of the level shifter to generate an analog voltage signal.

2. The source driving circuit as claimed in claim 1, wherein the switch array consists of NMOS transistors.

3. The source driving circuit as claimed in claim 2, wherein the level shifter further comprises a first buffer and a second buffer, the digital-to-analog converter is connected to the first output node via the first buffer, and the digital-to-analog converter is connected to the second output node via the second buffer.

4. The source driving circuit as claimed in claim 1, wherein the switch array consists of PMOS transistors.

5. The source driving circuit as claimed in claim 4, wherein the level shifter further comprises a first inverter and a second inverter, the digital-to-analog converter is connected to the first output node via the first inverter, and the digital-to-analog converter is connected to the second output node via the second inverter.

6. The source driving circuit as claimed in claim 1, wherein the digital-to-analog converter is in a high impedance state during the transition period.

7. A source driving circuit, comprising:
a first level shifter comprising:
a first transistor connected between a first output node and a reference node, and controlled by a first input signal;
a second transistor connected between a second output node and the reference node, and controlled by a second input signal, which is an inverse signal of the first input signal;
a third transistor connected between the first output node and a first power node, and controlled by an signal of the second output node;
a fourth transistor connected between the second output node and the first power node, and controlled by an signal of the first output node; and
a fifth transistor connected between the first power node and a power supply, and the fish transistor is turned off by a control signal while the first input signal and the second input signal are in a transition period in which the first input signal changes from a logic high to a logic low or the first input signal changes from a logic low to a logic high;
a first digital-to-analog converter comprising a first switch array, wherein the first switch array receives output signals from the first output node and the second output node of the level shifter to generate a first analog voltage signal;

a second level shifter comprising:
a sixth transistor connected between a third output node and the reference node, and controlled by a third input signal;
a seventh transistor connected between a fourth output node and the reference node, and controlled by a fourth input signal, which is an inverse signal of the third input signal;
an eighth transistor connected between the third output node and a second power node, and controlled by an signal of the fourth output node;
a ninth transistor connected between the fourth output node and the second power node, and controlled by an signal of the third output node; and
a tenth transistor connected between the second power node and the power supply, and the tenth transistor is turned off by the control signal while the third input signal and the fourth input signal are in the transition period in which the third input signal changes from a logic high to a logic low or the third input signal changes from a logic low to a logic high; and a second digital-to-analog converter comprising a second switch array, wherein the second switch array receives output signals from the third output node and the fourth output node of the level shifter to generate a second analog voltage signal.

8. The source driving circuit as claimed in claim 7, wherein the first level shifter further comprises a first buffer and a second buffer, the first digital-to-analog converter is connected to the third output node via the first buffer, and the first digital-to-analog converter is connected to the fourth output node via the second buffer.

9. The source driving circuit as claimed in claim 7, wherein the second level shifter further comprises a first inverter and a second inverter, the second digital-to-analog converter is connected to the third output node via the first inverter, and the second digital-to-analog converter is connected to the fourth output node via the second inverter.

10. The source driving circuit as claimed in claim 7, wherein the first digital-to-analog converter and the second digital-to-analog converter are in a high-impedance state during the transition period.

11. The source driving circuit as claimed in claim 7, wherein the first switch array consists of NMOS transistors, and the second switch array consists of PMOS transistors.

* * * * *